United States Patent [19]

Nukii et al.

[11] Patent Number: 4,764,413
[45] Date of Patent: Aug. 16, 1988

[54] METAL-BASED ORGANIC FILM SUBSTRATE

[75] Inventors: Takashi Nukii; Shigeo Nakabu, both of Nara; Masaru Iwasaki, Izumisano; Katunobu Awane, Ikoma, all of Japan

[73] Assignee: Sharp Kabushiki Kaisha, Osaka, Japan

[21] Appl. No.: 649,924

[22] Filed: Sep. 13, 1984

[51] Int. Cl.⁴ .................... B32B 23/02; B32B 15/08
[52] U.S. Cl. ............................ 428/192; 428/458; 428/461; 428/463; 428/473.5; 428/901
[58] Field of Search ............ 428/901, 458, 461, 473.5, 428/463

[56] References Cited

U.S. PATENT DOCUMENTS

| | | | |
|---|---|---|---|
| 4,369,220 | 1/1983 | Prabhu et al. | 428/901 X |
| 4,543,295 | 9/1985 | St. Clair et al. | 428/458 |
| 4,559,257 | 12/1985 | Nilsson | 428/458 |
| 4,562,119 | 12/1985 | Darms et al. | 428/458 |

Primary Examiner—Thomas J. Herbert
Attorney, Agent, or Firm—Birch, Stewart, Kolasch and Birch

[57] ABSTRACT

A substrate for wiring an electrical component with an external circuit, comprises a base plate for accommodating the electrical component therein, a first insulation layer made of an organic material formed on the base plate, a first wiring formed on the first insulating layer, a second insulation layer made of an organic material formed on the first wiring, a second wiring formed on the second insulation layer, the second wiring being coupled to the electrical component, the base plate, the first insulation layer, the first wiring, and the second insulation layer being bent at the marginal edges thereof, in which portions of the first wiring on the bent portions are made of a material having a low temperature of recrystallization.

20 Claims, 3 Drawing Sheets

METAL-BASED ORGANIC FILM SUBSTRATE

BACKGROUND OF THE INVENTION

The present invention relates to a wiring substrate and, more particularly, to a wiring substrate which is composed of thin conductors, organic film insulators and a metal base plate that can be press-formed.

A rigid insulation member such as a glass, a ceramic, and a glass epoxy, etc. is generally used as a wiring substrate for various electronic apparatuses. It is difficult to change the form of the conventional wiring substrate formed by the above rigid insulation layer, so that the flat type substrate is used for the electronic apparatus and spacer members are additionally required for accomodating a component such as an IC, an LSI, or the like on the wiring substrate.

In recent years, various types of flat display panels such as LCD, EL, PDP, etc. have been developed for various applications. However, it is difficult to make the display panel thin using the conventional substrate. Therefore, it is desired that the wiring substrate for an electronic apparatus enable the electronic apparatus to become thin.

SUMMARY OF THE INVENTION

Accordingly, it is an object of the present invention to provide an improved wiring assembly for accomodating a component such as an IC, an LSI, a resistor, or a coil therein.

It is another object of the present invention to provide a multilayer wiring substrate with press-forming capability which is composed of thin conductors, organic film insulators and a metal base plate.

It is still another object of the present invention to provide a multilayer wiring substrate made of a metal base plate, insulation layers such as an organic film with holes, and thin conductors, wherein the thin conductors are well adhered with the organic insulation base layer and extensible, so as to enable free bent-working.

It is a further object of the present invention to provide a wiring substrate made of a metal base plate having thin conductors thereon via an organic insulation layer, wherein the marginal edges of the metal base plate are bent and the thin conductors at the bent-portions of the metal base plate are metal conductors showing a low temperature of recrystallization and a high adhesion with the organic insulation layer.

It is a further object of the present invention to provide a wiring substrate made of a metal base plate, thin conductors, and organic insulation layers and for accomodating a component such as an IC, an LSI, or the like which is driven a flat type display device such as a LC display, a plasma display, an electroluminescent display, or the like.

Other objects and further applications of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

According to an embodiment of the present invention, a substrate for wiring an electrical component with an external circuit, comprises a base plate for accomodating the electrical component therein, an insulation layer made of an organic material formed on the base plate, wiring means formed on the insulation layer, the wiring means being coupled to the electrical component, the base plate substrate, the insulation layer, and the wiring means being bent at the marginal edges thereof, in which portions of the wiring means on the bent portions are made of a material having a low temperature of recrystallization.

According to another embodiment of the present invention, a substrate for wiring an electrical component with an external circuit, comprises a base plate for accomodating the electrical component therein, a first insulation layer made of an organic material formed on the base plate, a first wiring means formed on the first insulation layer, a second insulation layer made of an organic material formed on the first wiring means, a second wiring means formed on the second insulation layer, the second wiring being coupled to the electrical component, the base plate, the first insulation layer, the first wiring means, and the second insulation layer being bent at the marginal edges thereof, in which portions of the first wiring means on the bent edges are made of a material having a low temperature of recrystallization. Further, the first wiring means is well adhered to the first insulation layer and is made of Al or any alloy of Al.

The substrate of the present invention serves as a base for a flat display panel.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE INVENTION

FIGS. 1(a) through 1(g) show processes to produce a multilayer wiring substrate according to an embodiment of the present invention.

Figure 1A:
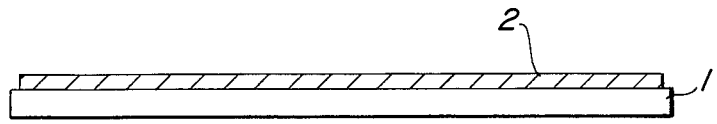
FIGS. 1(a) through 1(g) shows processes to produce a multilayer wiring substrate according to an embodiment of the present invention.
Figure 1B:
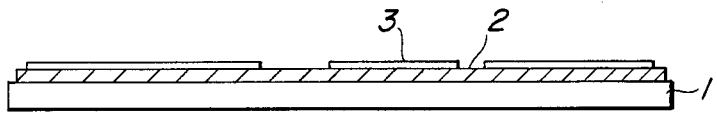
Figure 1C:
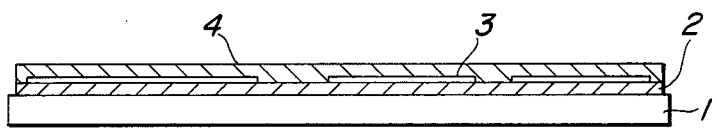
Figure 1D:
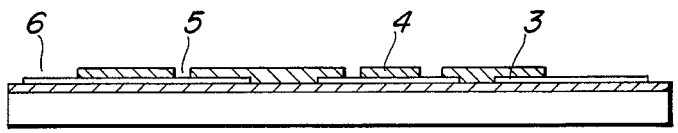
Figure 1E:
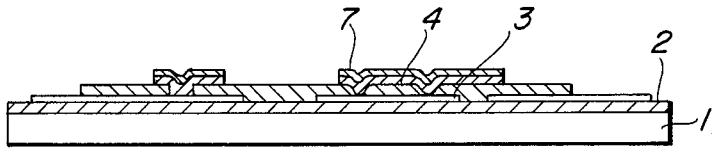
Figure 1F:
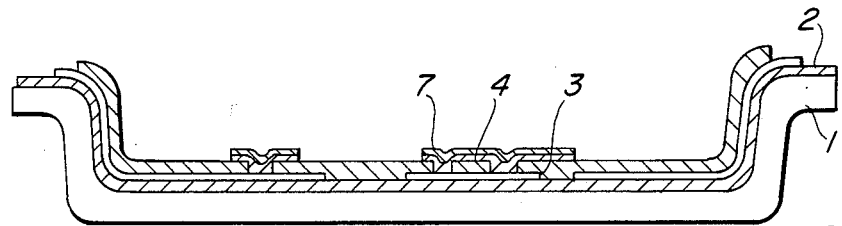
Figure 1G:
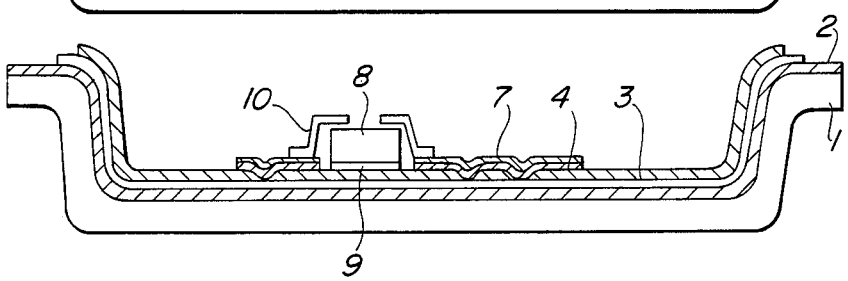

With reference to FIG. 1(g), a multilayer wiring substrate comprises a metallic substrate 1, a first organic insulation layer 2, a lower wiring 3 comprising thin conductors, a second organic insulation layer 4, an upper wiring 7 comprising thin conductors, a device 8 such as an IC (Integrated Circuit), an LSI (Large Integrated Circuit), a resistor, a condenser, a coil or the like, and terminal portions 6 for connecting with terminals of an external circuit. The marginal edges of the multilayer wiring substrate are bent for accomodating the device 8 such as the IC, the LSI or the like, by stamping, press-forming, drawing press, or bent-working.

The multilayer wiring substrate is prepared as shown in FIGS. 1(a) through 1(g) according to the following steps.

FIG. 1(a): A cleaned metallic base plate 1 is provided which is composed of Al, Cu or the like. A first organic insulation layer 2 such as a polyimide varnish, a polyamide varnish or the like is coated on the metallic base plate 1 by a roll-coating method or the like. The metallic base plate 1 coated with the first organic insulation layer 2 is baked, for example, at about 150 degrees C. (about 30 minutes) and about 250 degrees C. (about 30 minutes) in order to vaporize a solvent component in the varnish.

Such a material for the organic insulation layer 2 is not limited to the above varnishes. Other materials may be an organic material sheet in a semi-hardened form. Polyimide film or the like may be adhered as the first organic insulation layer 2 on the wiring substrate by any adhesive and, thereafter, may be heated or pressed to adhere. The first insulation layer 2 may be an insulator with flexibility, so that any selected material for the first organic insulation layer 2 may be a layer of polyamideimide, polyamicacid, fluorinated ethylene propylene (FEP) resin or the like all having adhesion.

The organic insulation layer 2 is protected from the destruction of the film by the flexibility of the organic insulation layer 2 and the small flexibility of the metallic base plate 1 even when the marginal edges of the multilayer substrate are bent by a drawing press, bent pressing, or press-forming, so that the high insulation of the organic insulation layer is maintained without any damage such as a pinhole or the like.

FIG. 1(b): Any deposition, such as vaccum evaporation, ion-beam deposition including sputtering and ion-clustering, or the like is applied to form a lower wiring 3 on the organic insulation layer 2 of the metallic base plate 1. The lower wiring 3 is preferably made of Al, any alloy of Al or the like in the form of a film.

Wiring patterns for the lower wiring 3 can be prepared by the following step:

After a layer for the lower wiring 3 is widely deposited over the entire surface of the organic insulation layer 2, any resist is coated over this layer. Photo etching is conducted to outline the conductors of the lower wiring 3.

Figure 4:
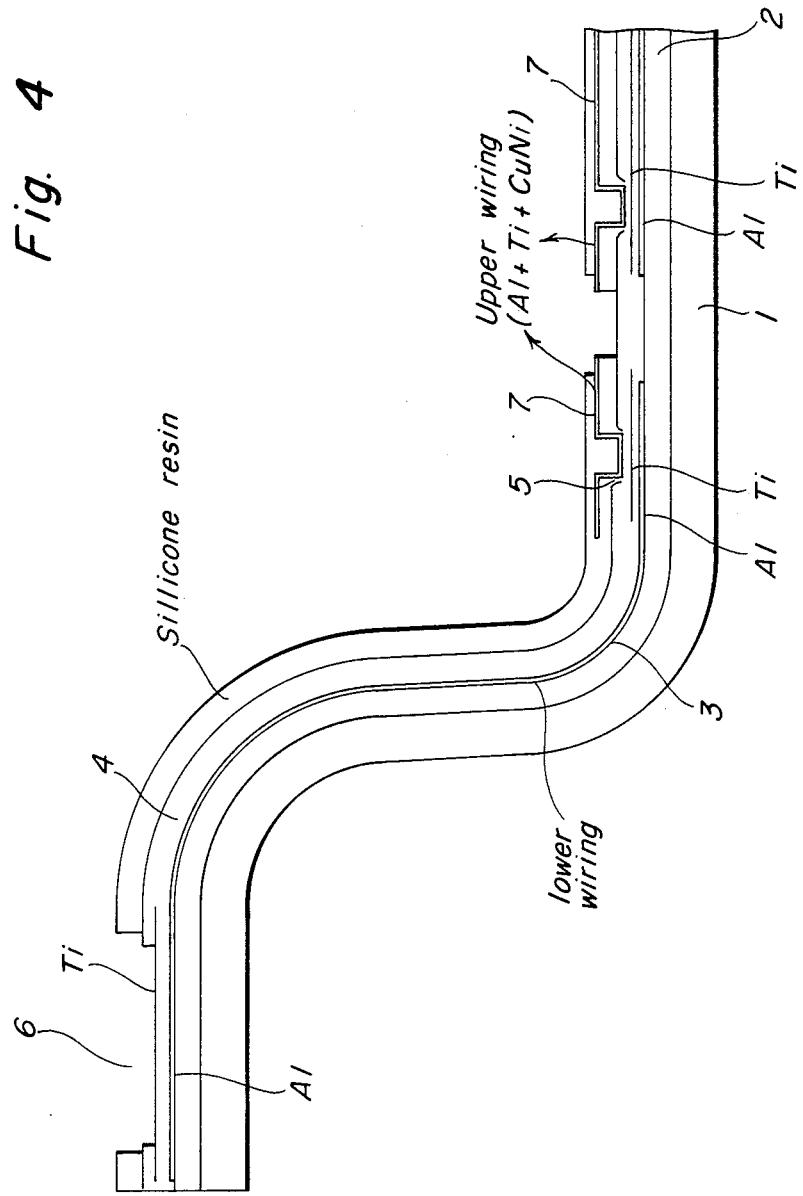
FIG. 4 show a sectional view of a multilayer wiring substrate according to another embodiment of the present invention.

In place of single layer wiring of Al, any alloy of Al or the like, the layer of Al, any alloy of Al or the like and another metallic layer such as Ti may be overlayered as the lower wiring 3 as shown in FIG. 4. At the bending portions of the wiring substrate, it is preferable that a thin film made of Al, any alloy of Al, etc., which is extensible and well adhered to the lower organic insulation layer, is only left. In the case where the lower wiring 3 comprises Al film and Ti film, a double thin film (Al+Ti) is sputtered on the first organic insulation layer 2 at a high rate. Ti thin film at the bending portion is etched by making use of printed resist as a mask so that only Al thin film exhibits the best characteristic to be press-formed. And then, the Al-Ti lower wiring patterns are formed by etching such as wet etching through another resist mask.

FIG. 1(c): After the desired patterns of the lower wiring 3 are formed, an adherent second organic insulation layer 4 such as a film made of polyimide coated with any adhesive is adhered on the lower wiring 3. The second organic insulation layer 4 is pressed toward the lower wiring 3 under elevated temperatures such as about 250 degrees C. The second organic insulation layer 4 is adhered to the first organic insulation layer 2 and the lower wiring conductors 3. It is very insulative and has capability of being subjected to etching treatment for preparing through holes.

Such a material for the organic insulation layer 4 is not limited to a layer of polyimide on which any adhesive may be coated. Other materials may be polyamideimide, polyamicacid or the like having adhesion in a semi-hardened form, or fluorinated ethylene propylene resin (FEP resin) or the like having thermal plasticity. No use of any adhesive is required. Otherwise, any resin can replace the organic insulation layer 4, the resin, for example, polyimide varnish, polyamide varnish or the like, being in a liquid or a paste-like form and being coated with printing or roller coating or the like.

FIG. 1(d): After a resist made of an organic material and an inorganic material is printed on the organic insulation layer 4, a through-hole 5 and terminal portions 6 are prepared by using the resist as a mask with $O_2$ plasma etching. According to the use of a combined resist of any organic material and any inorganic material as a mask, the advantage is offered, that, while the organic insulation layer 4 is subjected to plasma etching, the organic material included within the combined resist is also subjected to the etching so that a slope is produced around the though hole 5 so as to form a stable connection with the through hole 5.

In place of the plasma etching, wet etchings with hydrazine, NaOH etc. can be applied. In such a case, great care should be taken so that the lower wiring conductors 3 are not damaged and the material of the organic insulation layer 4 must be subjected to the wet etching. By virture of the plasma etching, any organic material is etched by $O_2$ plasma etching in which case a film of polyimide coated with any adhesive is advantageously used. But the wet etching cannot etch any adhesive.

FIG. 1(e): Any deposition such as ion-beam deposition is conducted to form an upper wiring 7 and a through-hole contact of a metallic film through the through-hole 5. The metallic film reaches the lower wiring 3. The upper wiring 7 is formed by Al layer, any alloy layer of Al or the like in the same manner of the lower wiring 3. The upper wiring 7 may be formed by single layer of Al, any alloy of Al, or the like, or a multilayer of Al and another metallic materials. At the bending portion of the wiring substrate, it is preferable that a thin film made of Al etc., which is extensible and well adhered to the lower layer, is only left, or that any wiring means is not disposed.

Figure 3:
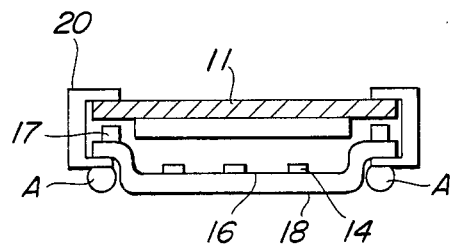
FIG. 3 shows a sectional view of a liquid crystal display module using the multilayer substrate according to the embodiment of the present invention.

In this embodiment of the present invention, the upper wiring 7 is a multilayer wiring made of Al and Ni or Cu. At the bending portions of the wiring substrate, the upper wiring 7 is not disposed. The two layers consisting of Al and Ni, or Al and Cu are preferable in that the layer of Al has capability of attaching to the organic insulation layer and the layer of Ni or Cu provides good contact with a soldering material which is used later. The upper wiring 7 may be a three-layered metallic film consisting of Al, Ti, and Ni-Cu alloy as shown in FIG. 3. Furthermore, as shown in FIG. 4, silicone resin may be coated over the upper wiring 7 and the second insulation layer 4, except for the connection portion of the device 8 and the terminal portions 6.

FIG. 1(f): Before the device 8 such as a tape carrier device of the IC, the LSI, or the like is disposed on the wiring substrate by soldering, the soldering paste 9 is printed on the connection portions on the wiring substrate. The connection portions may be provided at either the lower wiring 3 or the upper wiring 7. In the embodiment of the present invention, the connection portions are provided at the upper wiring 7, and outer leads 10 of the device 8 is connected the conductors of the upper wiring 7. After printing the soldering paste 9, the flat metallic base plate 1 having the organic insulation layer 2 and the lower and upper wirings 3 and 7 is mechanically bent by a drawing press, bent pressing, or press-forming to form a suitable shape of the wiring substrate. For example, the marginal edges of the wiring substrate are bent by the bent pressing as shown in FIG. 1(f) to form a concave section for accomodating the device 8.

FIG. 1(g): The tape carrier device 8 formed is directly diebonded on the second insulation layer 4 with the conductive paste 9, so that the outer leads 10 of the device 8 are connected to the conductors of the upper wiring 7 by soldering to form a conductive circuit.

Otherwise, the device 8 may be directly diebonded on the metallic base plate 1 with the conductive paste after the second organic insulation layer 4 on the metallic base plate 1 is removed by etching. In place of this, the device 8 may be diebonded with the conductive paste on the first organic insulation layer 2, the lower wiring 3, or the upper wiring 7. If necessary, diebonding is not used. The device 8 may be wireless chip such as beam lead chip, flip chip or the like, or a wire bonding chip. A plurality of the devices may be bonded on the wiring substrate.

In one embodiment of the present invention, though a two-layered wiring comprising the lower and upper wirings 2 and 4 is used, a single-layer wiring or a multi-layered wiring having more than two layers may also be used.

After the device 8 is disposed on the wiring substrate, the wiring substrate may be bent. Also, after the wiring substrate is bent, the device 8 may be disposed.

The thin wiring material at the bent portions of the wiring substrate formed by above manner will be described below.

When the wiring substrate is bent, the metallic base plate such as Al, or the like, the organic insulation layer, and the thin wiring are extended. Accordingly, materials such as Al, or the like having a low temperature of recrystallization is effective as the wiring material in order to prevent the wiring from disconnecting.

Figure 2:
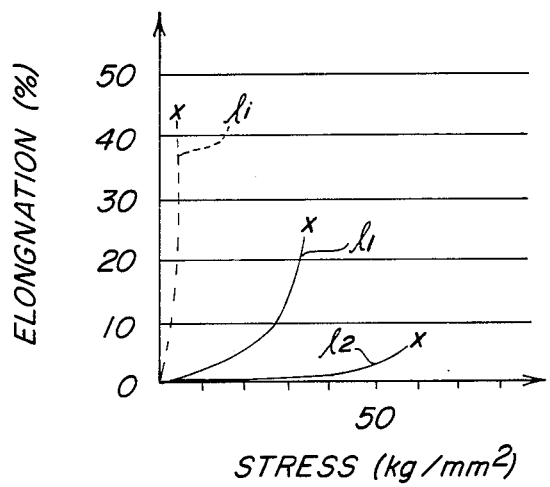
FIG. 2 shows a graph of Stress-Extention curve of wiring material.

When the wiring material is coated on the substrate by sputtering, the surface temperature of the substrate is elevated at about 200 degrees C.—about 350 degrees C. If the layer of Al is used as the wiring material at the bent portions of the wiring substrate, the layer of Al is placed in an annealing state when the surface temperature of the wiring substrate is over about 200 degrees C. by sputtering because the recrystallization temperature of Al is about 200 degree C. Accordingly, as shown in FIG. 2, the Stress-Extention curve of the wiring material changes to an $l'_1$ state from an $l_1$ state, so that an extensive feature following extention is increased and the disconnection is decreased.

If Al or any alloy of Al is used as the wiring material at the bent portions of the wiring substrate, the reliability of the wiring is increased when the above material has the capability of attaching to the organic layer and has the same ratio as the organic insulation layer has for a heat extention ratio. On the contrary, in the case where the wiring material used is any alloy of Cu and Ni, or the like having a high temperature of recrystallization over the heated temperature for sputtering at the bent portions of the wiring substrate, the wiring substrate must be heated up to the heated high temperature so as to improve the extention feature of the wiring material in the annealing state. For example, a, CuNi Alloy is shown in the Stress-Extention curve $l_2$ in FIG. 2. If CuNi is used, by sputtering at the high temperature, the problems of the process may happen, for example, wherein the substrate is softened and the organic insulation film is deteriorated.

In the case where a two-layered wiring of Al and CuNi alloy (materials having a low temperature of recrystallization and high temperature of recrystallization) is used as the wiring at the bent portion of the substrate, Al has capability of attaching to the CuNi alloy, so that the disconnection of the wiring is caused by the disconnection of CuNi alloy.

Disconnection (burnout) ratios before and after the bending of the substrate is shown in Table 1.

TABLE 1

| metallic plate wiring | | Al base plate | | |
|---|---|---|---|---|
| | | Al | Cu—Ni | Al + Cu—Ni |
| burnout (bent portion) | No. 1 | 0/600 | 183/600 | 511/600 |
| | No. 2 | 0/600 | 504/600 | 412/600 |
| | No. 3 | 0/600 | 465/600 | 228/600 |
| | No. 4 | 0/600 | 206/600 | 376/600 |
| | No. 5 | 0/600 | 351/600 | 483/600 |

As shown in Table 1, when the metallic plate coated with the organic insulation layer and the thin wiring is a base substrate, the wiring material at the bent portion of the substrate may have the following features.

The wiring material has the capability of attaching with the organic insulation layer and has the same heat extension ratio as the organic insulation layer. Further, the wiring material is placed in the annealing state over the recrystallization temperature when increasing the temperature by sputtering. For example, the wiring at the bent portion of the substrate may be a single-layered wiring such as Al, any alloy of Al, or the like, or a multilayered thin wiring.

The wiring substrate according to an embodiment of the present invention is used for accomodating a driving circuit of a liquid crystal panel as shown in FIG. 3.

The marginal edges of the wiring substrate are bent to form a concave section for accomodating a device such as the IC, the LSI, or the like for driving the display panel.

A wiring substrate 18 having bent edges is disposed on the rear surface of a liquid crystal display panel 11, and a plurality of terminals of the liquid crystal display panel are connected with a plurality of terminals provided at ends of the bent portions of the wiring substrate 18 with minute pitches via a conductive rubber 17. As described above, Al or any alloy of Al, or the like, having capability of attaching with the organic insulation layer, are coated on the organic insulation layer at the bent portions of the metallic base plate as the wiring material.

An electronic component 14 such as an IC, an LSI or the like, is disposed on the concave section formed by bending the marginal edges of the wiring substrate. In the above construction, the thickness of the conductive rubber 14 and a clearance between the components can be freely determined.

Accordingly, the terminals of the liquid crystal display panel are connected to the terminals of the wiring substrate with about 5 lines/mm via the conventional thin conductive rubber.

If clips 20 for the conductive rubber are required, the thickness of the display panel is not increased by using a space A produced by bending the substrate.

As shown in FIG. 3, the liquid crystal television module becomes compact and thin by using the wiring substrate according to an embodiment of the present invention.

The display device using the wiring substrate of the present invention is not limited to a liquid crystal display television. The wiring substrate of present invention is applied to flat display devices such as an electroluminecent display, a plasma display, and an electrochromic display and the like, and a study machine or game machine having a dot matrix display without halftone display colors.

The multilayer substrate according to an embodiment of the present invention may be applied to various type electronic apparatus except the display device.

The invention being thus described, it will be obvious that the invention may be varied in many ways. Such variations are not to be regarded as a departure from the spirit and scope of the invention, and all such modifications are intended to be included within the scope of the following claims.

What is claimed is:

1. A substrate for wiring an electrical component with an external circuit, comprising:
   a metal base plate for accommodating said electrical component therein;
   an insulation layer made of an organic material formed on the base plate;
   electrically conductive wiring means of metal or metal alloy, formed on the insulation layer, for connecting said external circuit with the electrical component;
   the metal base plate, the insulation layer, and the electrically conductive wiring means being bent at the marginal edges thereof, with portions of the electrically conductive wiring means on the bent portions being made of a material having a low temperature of recrystallization.

2. The substrate of claim 1, wherein, at the bent-portion, the wiring means is a single-layer.

3. The substrate of claim 1, wherein the wiring means is adhered to the insulation layer.

4. The substrate of claim 1, wherein the wiring means is made of aluminum or an alloy of aluminum.

5. The substrate of claim 1, wherein the base plate is a metallic base plate made of aluminum or copper.

6. The substrate of claim 1, wherein the substrate serves as a base for a flat display panel.

7. The substrate of claim 6, wherein the flat display panel is selected from the group consisting of a liquid crystal display, a plasma display, an electroluminecent display and an electrochromic display.

8. A substrate for wiring an electrical component with an external circuit, comprising:
   a metal base plate for accommodating said electrical component therein;
   a first insulation layer made of an organic material formed on the base plate;
   first electrically conductive wiring means of metal or metal alloy, formed on the first insulation layer for connecting said external circuit with said substrate;
   a second insulation layer made of an organic material formed on the first wiring means;
   second electrically conductive wiring means of metal or metal alloy, formed on the second insulation layer for connecting said substrate with the electrical component;
   the metal base plate, the first insulation layer, the first wiring means, and the second insulation layer being bent at the marginal edges thereof, with portions of the first wiring means on the bent portions being made of a material having a low temperature of recrystallization.

9. The substrate of claim 8, wherein at least one of the organic insulation layers is a polyimide varnish or film.

10. The substrate of claim 8, wherein the organic insulation layers are selected from the group consisting of polyamideimide, polyamicacid, fluorinated ethylene propylene resin and polyamide varnish.

11. The substrate of claim 8, wherein the second wiring means is a multilayer wiring comprising aluminum and nickel or aluminum and copper.

12. The substrate of claim 8, wherein the second wiring means is a three layer metallic film of aluminum, titanium and a nickel-copper alloy.

13. The substrate of claim 8, wherein a silicon resin at least partially covers the second wiring means and the second insulation layer.

14. The substrate of claim 8, wherein the first wiring means is adhered to the first insulation layer.

15. The substrate of claim 8, wherein the substrate serves as a base for a flat display panel selected from the group consisting of a liquid crystal display, a plasma display, an electroluminecent display and an electrochromic display.

16. The substrate of claim 8, wherein the first wiring means is a single layer at the bent portion.

17. The substrate of claim 8, wherein the base plate is a metallic base plate made of aluminum or copper.

18. A substrate for wiring an electrical component with an external circuit, comprising:
   a metal base plate of aluminum or copper for accommodating said electrical component therein;
   an insulation layer made of an organic material selected from the group consisting of polyamideimide, polyamicacid, fluorinated ethylene propylene resin and polyamide varnish formed on the base plate;
   electrically conductive wiring means comprising aluminum, an alloy of aluminum, titanium or a mixture thereof, formed on the insulation layer, for connecting said external circuit with the electrical component;
   the metal base plate, the insulation layer and the electrically conductive wiring means being bent at the marginal edges thereof, with portions of the electrically conductive wiring means on the bent portion being made of a material having a low temperature of recrystallization.

19. A substrate for wiring an electrical component with an external circuit, comprising:
   a metal base plate of aluminum or copper for accommodating said electrical component therein;
   a first insulation layer made of an organic material selected from the group consisting of polyamideimide, polyamicacid, fluorinated ethylene propylene resin and polyamide varnish;
   first electrically conductive wiring means comprising aluminum, an alloy of aluminum, titanium, or a mixture thereof, formed on the first insulation layer, for connecting said external circuit with said substrate;

second insulation layer made of an organic material selected from the group consisting of polyamide-imide, polyamicacid, fluorinated ethylene propylene resin and polyamide varnish;

second electrically conductive wiring means comprising aluminum, an alloy of aluminum, titanium, nickel, copper or a mixture thereof, formed on the second insulation layer, for connecting said substrate with the electrical component;

the metal base plate, the first insulation layer, the first wiring means, and the second insulation layer being bent at the marginal edges thereof, with portions of the first wiring means on the bent portions being made of a material having a low temperature of recrystallization.

20. A substrate for wiring an electrical component with an external circuit, comprising:

a metal base plate for accommodating said electrical component therein;

a first insulation layer made of an organic material formed on the base plate;

first electrically conductive wiring means comprising aluminum and titanium, aluminum or an alloy of aluminum, formed on the first insulation layer for connecting said external circuit with said substrate;

a second insulation layer made of an organic material formed on the first wiring means;

second electrically conductive wiring means of metal or metal alloy, formed on the second insulation layer for connecting said substrate with the electrical component;

the metal base plate, the first insulation layer, the first wiring means, and the second insulation layer being bent at the marginal edges thereof, with portions of the first wiring means on the bent portions being made of a material having a low temperature of recrystallization.

* * * * *